(12) United States Patent
Brandenburg et al.

(10) Patent No.: US 10,712,632 B2
(45) Date of Patent: Jul. 14, 2020

(54) SYSTEMS AND METHODS FOR OPTICAL COMPUTING AND AMPLIFYING

(71) Applicants: John Brandenburg, Brea, CA (US);
Paul Murad, Vienna, VA (US);
Morgan Boardman, Santa Barbara, CA (US)

(72) Inventors: John Brandenburg, Brea, CA (US);
Paul Murad, Vienna, VA (US);
Morgan Boardman, Santa Barbara, CA (US)

(*) Notice: Subject to any disclaimer, the term of this patent is extended or adjusted under 35 U.S.C. 154(b) by 0 days.

(21) Appl. No.: 16/438,643

(22) Filed: Jun. 12, 2019

(65) Prior Publication Data

US 2019/0294025 A1    Sep. 26, 2019

Related U.S. Application Data

(62) Division of application No. 15/184,184, filed on Jun. 16, 2016, now Pat. No. 10,345,679.

(60) Provisional application No. 62/230,813, filed on Jun. 16, 2015.

(51) Int. Cl.
*G02F 3/00* (2006.01)
*G02F 1/09* (2006.01)
*G02F 1/01* (2006.01)
*H01L 39/22* (2006.01)
*H01L 39/02* (2006.01)
*H01L 39/10* (2006.01)

(52) U.S. Cl.
CPC .............. *G02F 3/00* (2013.01); *G02F 1/0126* (2013.01); *G02F 1/09* (2013.01); *G02F 1/092* (2013.01); *H01L 39/025* (2013.01); *H01L 39/10* (2013.01); *H01L 39/223* (2013.01); *G02F 2202/12* (2013.01)

(58) Field of Classification Search
None
See application file for complete search history.

(56) References Cited

U.S. PATENT DOCUMENTS 4,181,902 A * 1/1980 Scott ............... H01L 39/223
331/107 S
2002/0149830 A1* 10/2002 Cottrell .................. G02F 1/09
359/280

* cited by examiner

*Primary Examiner* — Crystal L Hammond
(74) *Attorney, Agent, or Firm* — The Law Office of Richard F. Jaworski, PC (57) ABSTRACT

An optical device includes a photonically controlled Josephson Junction and a Faraday rotator cell magnetized by the Josephson Junction.

15 Claims, 6 Drawing Sheets

SYSTEMS AND METHODS FOR OPTICAL COMPUTING AND AMPLIFYING

CROSS-REFERENCE TO RELATED APPLICATIONS

This is a divisional application of U.S. patent application Ser. No. 15/184,184 filed Jun. 16, 2016 which claims priority to U.S. Provisional Application Ser. No. 62/230,813, filed on Jun. 16, 2015.

BACKGROUND

Technical Field

The present disclosure relates generally to computing and amplifying and, more particularly, to systems and methods for optical computing and amplifying.

Description of the Background Art

Transistors in one form or another have been utilized for developing computing and amplification circuitry. Transistors when first developed were relatively large bulky devices. Transistors have been reduced in size and are now generally provided on semiconductor wafers and in the form of semiconductor chips. The density and speed of semiconductor chips has grown tremendously. It has been estimated that in a standard quad core processor there can be over 1 billion transistors. Moore's Law is an observation that the number of transistors in a dense integrated circuit doubles every two years. Accordingly, for Moore's law to be true, the transistor needs to decrease in size every 2 years. However, manufacturers are faced with certain physical limits that can prevent the further reduction in size of the transistor. For example, at a certain size, the number of silicon atoms between transistor terminals will be so small that electrons will easily pass through the barrier when they should not. Accordingly, at some point in time, transistor size will no longer be able to be reduced utilizing traditional technology. Manufacturers are also faced with other physical limitations when reducing the size of semiconductor transistors and when putting more and more transistors into smaller and smaller semiconductor packages. For example, these denser semiconductor packages can produce a tremendous amount of heat which needs to be accounted for when utilizing these semiconductor packages in circuits Accordingly, a need exists for devices capable of operating at high rates of speed in dense packages and at low temperatures.

SUMMARY

An optical device includes a photonically controlled Josephson Junction and a Faraday rotator cell magnetized by the Josephson Junction.

An optical device includes a loop of superconducting material, a Faraday material in proximity to the loop of superconducting material and at least one magnet providing a magnetic field in which the loop of superconducting material and Faraday material are immersed.

An optical logic gate includes a first optical device including a first photonically controlled Josephson Junction controlled by a first optical control signal, and a first Faraday rotator cell magnetized by the first photonically controlled Josephson Junction, wherein the first Faraday rotator cell passes rotated or un-rotated polarized light depending on whether the first optical control signal is present. A second optical device is arranged in at least of series and parallel with the first optical device. The second optical device includes a second photonically controlled Josephson Junction controlled by a second optical control signal, and a second Faraday rotator cell magnetized by the second photonically controlled Josephson Junction, wherein the second Faraday rotator cell passes rotated or un-rotated polarized light depending on whether the second optical control signal is present.

BRIEF DESCRIPTION OF THE DRAWINGS

A more complete appreciation of the present disclosure and many of the attendant advantages thereof will be readily obtained as the same becomes better understood by reference to the following detailed description when considered in connection with the accompanying drawings, wherein.

DETAILED DESCRIPTION

The following exemplary embodiments are set forth to aid in an understanding of the subject matter of this disclosure, but are not intended, and may not be construed, to limit in any way the claims which follow thereafter. Therefore, while specific terminology is employed for the sake of clarity in describing some exemplary embodiments, the present disclosure is not intended to be limited to the specific terminology so selected, and it is to be understood that each specific element includes all technical equivalents which operate in a similar manner.

Illustrative embodiments of the present disclosure relate to optical switching and/or amplifying devices and are referred to herein as optical switching/amplifying devices or the device or devices for short. Specific embodiments of the present disclosure may be referred to herein as optical switching devices and/or optical amplification devices. The devices described herein operate utilizing photons instead of electrons as used in traditional electronic transistors. The devices operate as an optically controlled, optically read, superconducting Josephson junction and can control light output based on light input. One salient difference between an electronic transistor and the devices described in the present disclosure is that the presently described devices are capable of performing switching functions and amplification functions but without high power dissipation levels because they operate in a superconducting state. These functions have importance from communication devices to redesigning faster optical computers that use photons instead of electrons. Because the devices described in the present disclosure operate as an optically controlled superconducting Josephson junction they can switch states with very low power dissipation compared to an electrically driven semiconductor device. This allows much higher numbers of devices to be fabricated on a chip than is possible with transistors. In addition, the devices described herein operate utilizing photons rather than electrons, enabling much faster signal propagation inside a computer and hence, faster computing speed. The devices can function separately as an optical analog to the transistor and can be hybridized to support existing electronic infrastructure.

Embodiments of the present disclosure thus provide rapid optically controlled switching and light amplification devices. The devices are based on the combination of a Photonically controlled Josephson Junction (PJJ) and a Faraday rotator cell magnetized by a Josephson Junction. The Verdet constant is an optical "constant" that describes the strength of the Faraday effect for particular materials. According to embodiments of the present disclosure, optical amplification devices utilize Faraday rotation materials having high Verdet constants, so that even small changes in magnetic flux will produce useful levels of Faraday rotation. The PJJ is a Josephson Junction with a weak link composed by using a photoconductor such as lead or cadmium sulphide. The tunneling of Cooper pair electrons into the non-superconducting gap in the PJJ is controlled by the photonically controlled conductivity of the gap. This is controlled by the illumination of the gap with photons. Since the gap is small, the amount of light needed to control the magnetic state of the PJJ is also small. The magnetic state of the PJJ may then be read photonically using the Faraday rotation of polarized light that bounces repeatedly through the PJJ, which is created by a superconducting loop fabricated on a Faraday active substrate. The device thus combines several physical phenomena including, for example, the optical switching of a superconducting Josephson Junction (JJ) via illumination of a photo-conducting "weak-link" in the JJ, and the Faraday rotation of light wave polarization by magnetic fields in the interior of the JJ superconducting loop.

As noted above, to achieve high levels of amplification of light signals, a material with high Verdet constant, that is a high level of Faraday rotation of light versus magnetic field may be utilized. Materials are available for which the Verdet constant increases at cryogenic temperatures used to create a superconducting state. Examples of suitable materials having high Verdet constants include, but are not limited to the family of compounds Cadmium-Manganese-Telluride and Mercury-Cadmium-Manganese-Telluride: Cd0.5Mn0.5Te, Cd0.63Mn0.3Te, Cd0.75Mn0.25Te, and Cd0.39Mn0.39Hg0.22Te. To achieve as high an optical gain as possible, embodiments of the present disclosure may utilize as strong a magnetic field as possible with as many reflections and as strong a Verdet constant that is possible to achieve high gain. Operating as optical switching devices, less gain is generally required, where a gain of 1 is sufficient.

Embodiments of the present disclosure may be utilized to provide all-optical computing, and allow much higher computing speeds due to the more rapid speed of photons through a dielectric than the speed of electrons in semiconductors and the very low electric power dissipated during operation. Embodiments of the present disclosure may be utilized in optical repeater modules in long fiber optic media lines eliminating photon-to-electron and electron-to-photon interfaces on signal boosters that are now required in traditional optical repeater modules. In optical sensors, embodiments of the present disclosure function as sensitive light intensifier arrays. Embodiments of the present disclosure may also be used with current infrastructure using full electronic components in a hybrid fashion.

Figure 5:
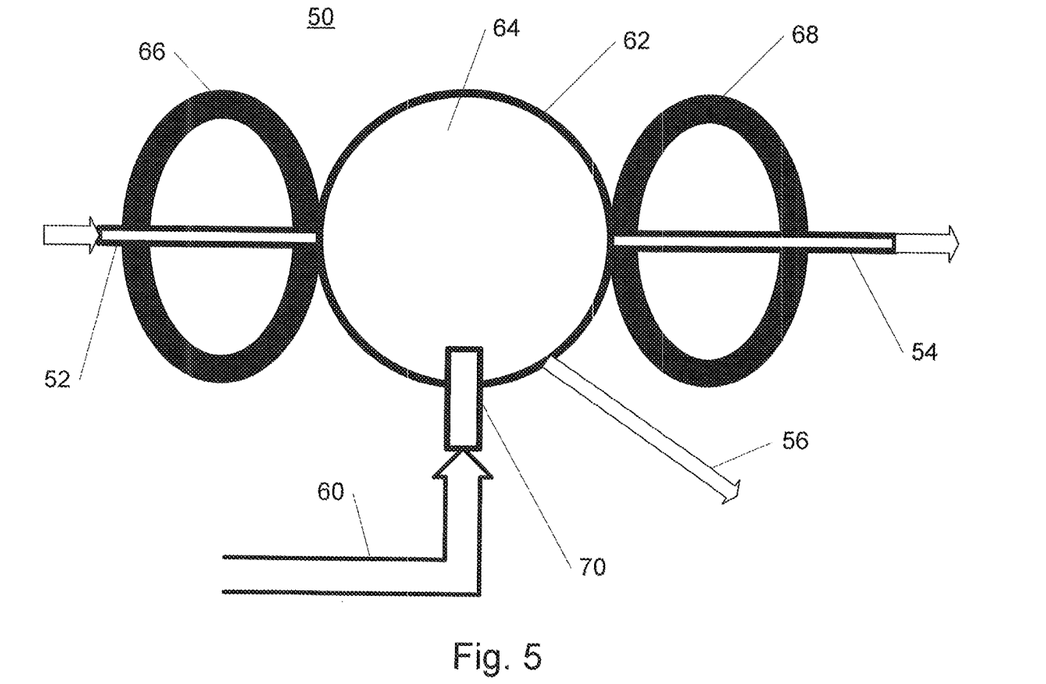
FIG. 5 shows a superconducting loop according to illustrative embodiments of the present disclosure.

A superconducting loop according to embodiments of the present disclosure is shown in FIG. 5 and is referred to generally as superconducting loop 50. The superconducting loop 50 includes a loop of superconducting material 62 that is filled with or fabricated on a Faraday rotator material 64 immersed in a magnetic field provided by magnets 66, 68. The loop of superconducting material 62 includes a "weak link" 70 forming a Josephson Junction. Generally, the "weak link" 70 may consist of a thin insulating barrier (known as a superconductor-insulator-superconductor junction, or S-I-S), a short section of non-superconducting metal (S-N-S), or a physical constriction that weakens the superconductivity at the point of contact (S-s-S). According to an embodiment of the present disclosure, the gap or "weak link" 70 is a photoconductor material such as, for example, lead or cadmium sulphide and is capable of being illuminated with a control light signal via optical waveguide 60. Depending on whether the control light signal is present or not, the polarization of light passing through loop 62 is either rotated or is not rotated. For example, when the control light signal is present, it illuminates the gap 70 in the loop of superconducting material 62, creating a Meissner effect which excludes the magnetic field. In this state, the plane of polarization of light passing through the Faraday material in superconducting loop 62 is not rotated. When the control light signal is not present, the magnetic field is present and the Faraday material rotates the plane of polarization of light passing through superconducting loop 62. The light then is effectively blocked by a polarizer from output waveguide 54, being either absorbed or diverted into an output waveguide 56 to be absorbed or utilized elsewhere. According to various embodiments of the present disclosure, the superconducting loop 50 may be utilized to create optical switching devices and/or optical amplification devices as described below.

Figure 1:
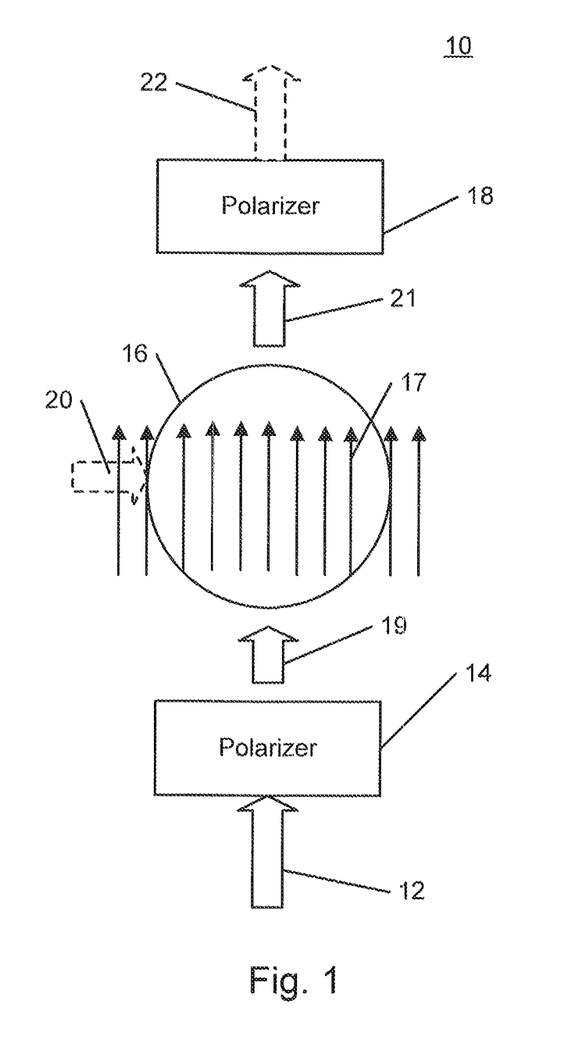
FIG. 1 shows an optical switching device according to an illustrative embodiment of the present disclosure.
Figure 2:
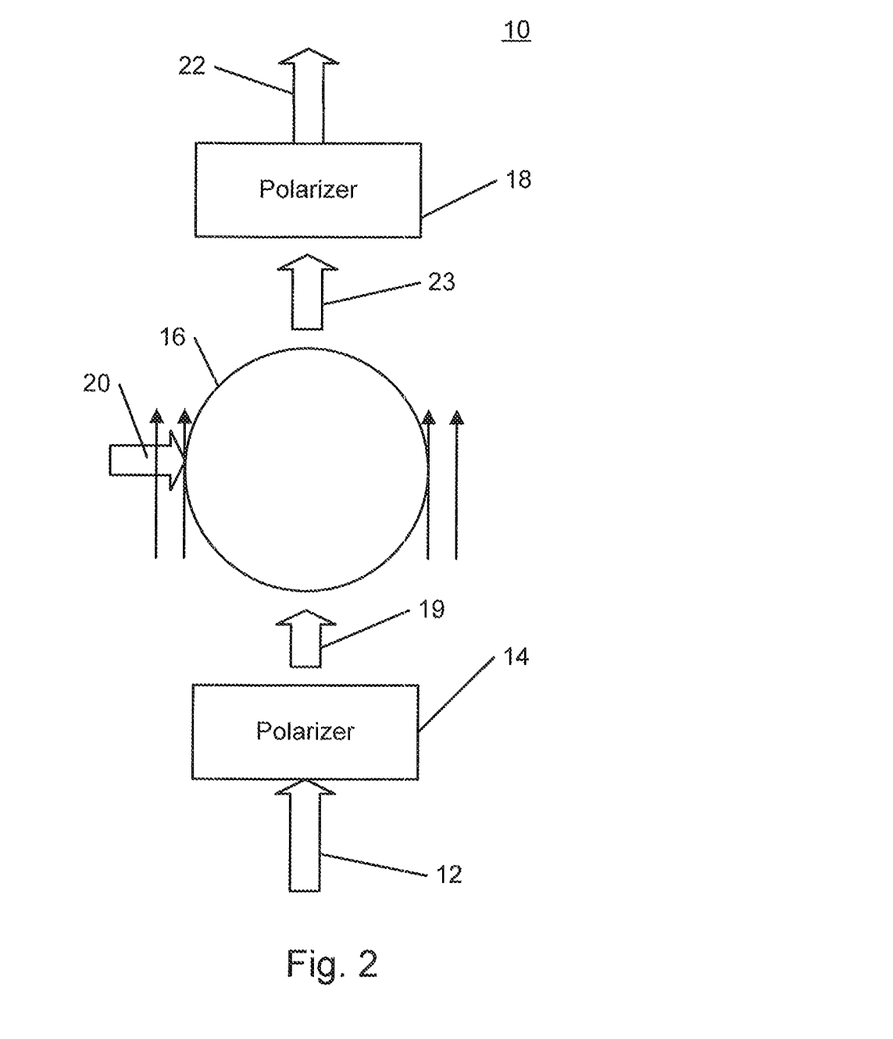
FIG. 2 shows optical switching device according to the illustrative embodiment of the present disclosure.

An optical switching device according to an illustrative embodiment of the present disclosure is shown in FIGS. 1 and 2 and is referred to generally as optical switching device 10. Light transmitted via a light source such as an optical waveguide 12 is passed through polarizer 14 providing polarized light 19 to superconducting loop 16 which is similar to superconducting loop 50 described above. Control light source 20 controls whether rotated or un-rotated polarized light is output to polarizer 18. Rotated polarized light will be effectively blocked, by being either absorbed or diverted to a "light dump" or other utilization, by polarizer 18 and un-rotated polarized light will pass through polarizer 18 to optical waveguide 22. As noted above, superconducting loop 16 includes a gap or "weak link" filled with a photoconductor that receives a control light signal from control light source 20 via an optical waveguide. As depicted in FIG. 1, when the control light signal from control light source 20 is not illuminating the gap or "weak link" in the loop of superconducting material 16, the magnetic field 17 is present and the polarization of the light passing through the Faraday material in superconducting loop 16 is rotated. The rotated polarized light 21 is blocked by polarizer 18. As depicted in FIG. 2, when the control light signal from control light source 20 is present, it illuminates the gap or "weak link" in the loop of superconducting material 16 and a Meissner effect is created that excludes the magnetic field (FIG. 2), meaning the plane of polarization is no longer rotated on the light passing through the Faraday material in superconducting loop 16. The non-rotated light 23 passes through the aligned polarizer 18 and to optical waveguide 22.

Figure 3:
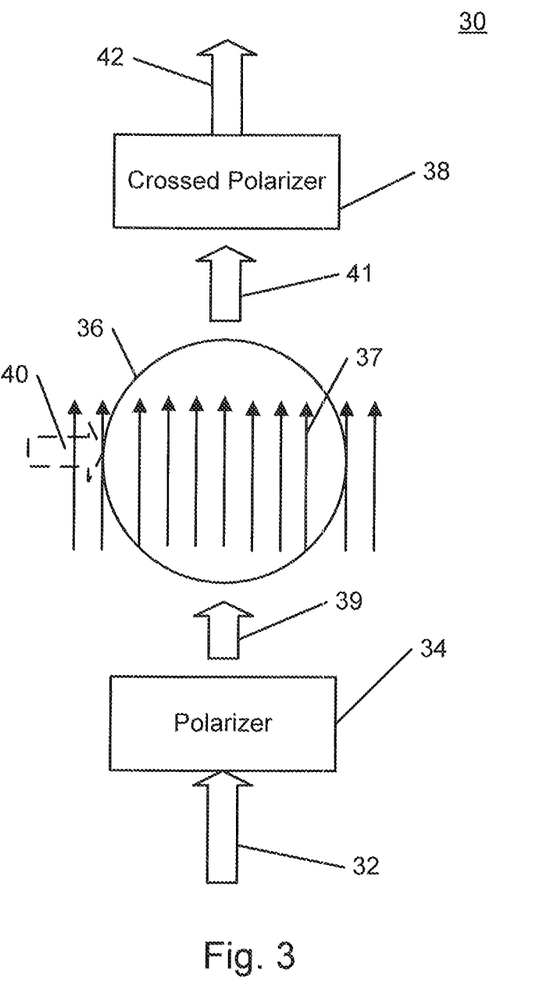
FIG. 3 shows an optical switching device according to an illustrative embodiment of the present disclosure.
Figure 4:
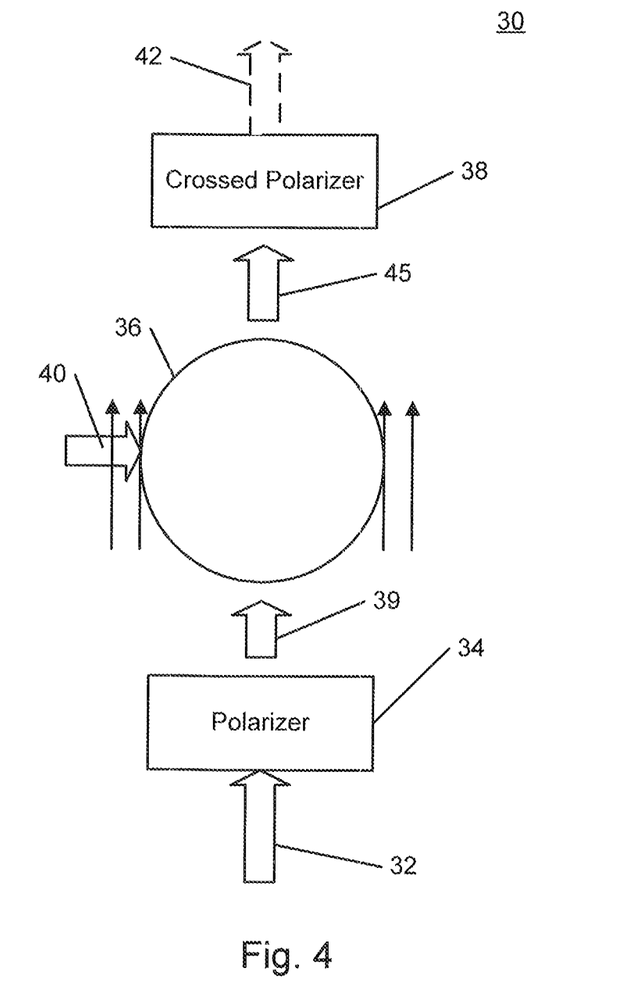
FIG. 4 shows an optical switching device according to an illustrative embodiment of the present disclosure.

An optical switching device according to another illustrative embodiment of the present disclosure is shown in FIGS. 3 and 4 and is referred to generally as optical switching device 30. In contrast to the above-described optical device 10, optical device 30 passes light when the control light signal is absent and it blocks light when the control light signal is present. Light transmitted via a light source such as an optical waveguide 32 is passed through polarizer 34 providing polarized light 39 to superconducting loop 36 which is similar to superconducting loop 50 described above. Control light source 40 controls whether rotated or un-rotated polarized light is output to polarizer 38. Rotated polarized light will effectively pass through crossed polarizer 38 to waveguide 42 and un-rotated polarized light will be effectively blocked by crossed polarizer 38. As noted above, superconducting loop 36 includes a gap or "weak link" filled with a photoconductor that receives a control light signal from control light source 40 via an optical waveguide. As depicted in FIG. 3, when the control light signal from control light source 40 is not illuminating the gap or "weak link" in the loop of superconducting material 36, the magnetic field 37 is present and the polarization of the light passing through the Faraday material in superconducting loop 36 is rotated. The rotated polarized light 41 will effectively pass through crossed polarizer 38. As depicted in FIG. 4, when the control light signal from control light source 40 is present, it illuminates the gap or "weak link" in the loop of superconducting material 36 and a Meissner effect is created that excludes the magnetic field, meaning the plane of polarization is no longer rotated on the light passing through the Faraday material in superconducting loop 36. The non-rotated polarized light 45 is effectively blocked by crossed polarizer 38.

Figure 6A:
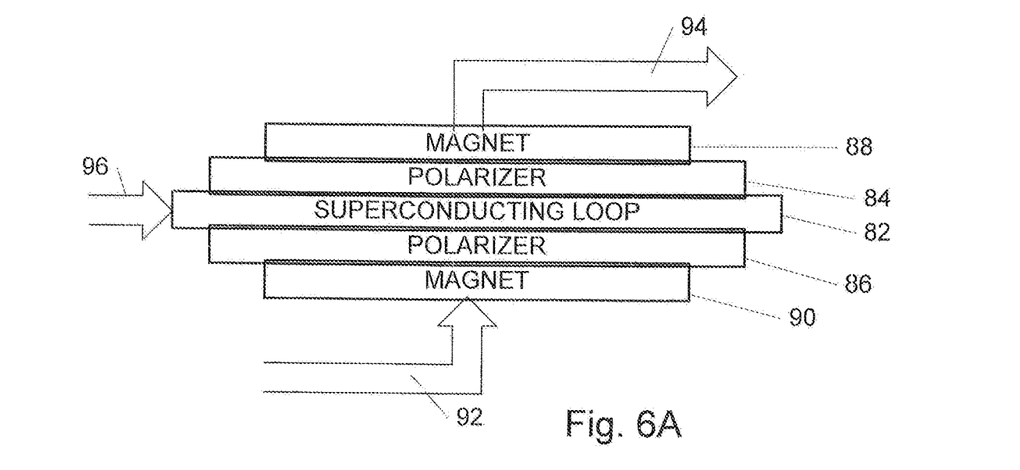
FIGS. 6A-6C show layered arrangements of optical switching devices according to illustrative embodiments of the present disclosure.
Figure 6B:
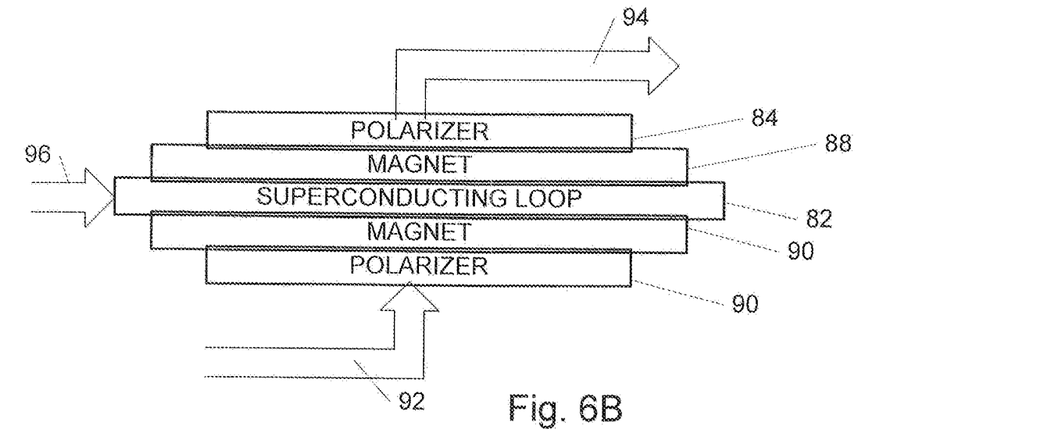
Figure 6C:
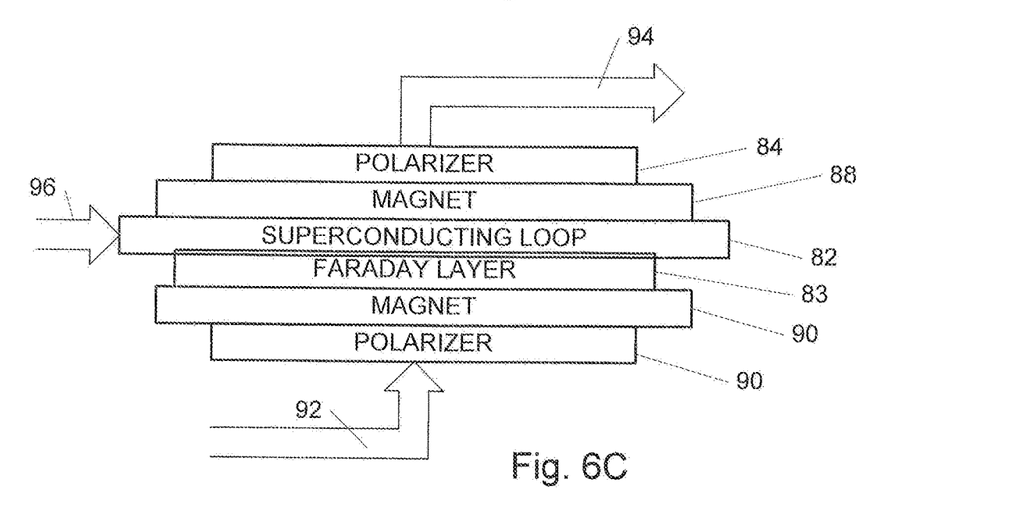

According to embodiments of the present disclosure, the materials making up the optical switching devices as described above may be arranged in layers as shown in FIGS. 6A-6C. According to an embodiment of the present disclosure, a loop of superconducting material 82 is filled with a Faraday material and is sandwiched between polarizers (or crossed polarizers) 84, 86 and magnets 86, 88 as shown. Optical waveguide 92 provides throughput light to the device, optical waveguide 94 outputs light passing through polarizer 84 and optical waveguide 96 provides an optical control light signal to the device. According to another illustrative embodiment of the present disclosure, the positions of the magnets 88, 90 and polarizers 84, 86 may be switched as shown in FIG. 6B. According to another illustrative embodiment of the present disclosure as shown in FIG. 6C, the loop of superconducting material 82 is provided on a layer of Faraday material 83. Magnets 88, 90 and polarizers 84, 86 are arranged in a manner similar to that shown in FIG. 6A. According to another embodiment of the present disclosure, in the device depicted in FIG. 6C, magnets 88, 90 and polarizers 84, 86 may be arranged in a manner similar to that shown in FIG. 6B.

Figure 7A:
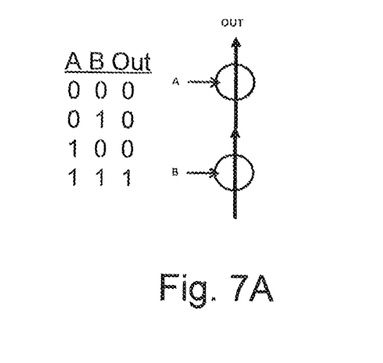
FIGS. 7A and 7B show an optical AND gate and an optical NAND gate, respectively, according to illustrative embodiments of the present disclosure.
Figure 7B:
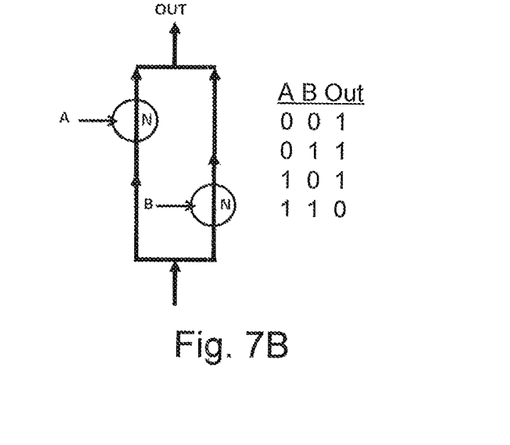

The optical switching devices according to the above-described embodiments may be utilized to create logic gates which are the basis for all computing designs. For example, according to an embodiment of the present disclosure, the optical devices 10 described above with respect to FIGS. 1 and 2 can be arranged in series to create an AND gate as shown in FIG. 7A. According to this embodiment light is only allowed to pass through the AND gate when light is input to both control light source channels A and B. According to another embodiment of the present disclosure, the optical devices 30 described above with respect to FIGS. 3 and 4 can be arranged in parallel to create a NAND gate as shown in FIG. 7B. According to this embodiment, light is only prevented from passing through the NAND gate when light is input to both control light source channels A and B.

Embodiments of the present disclosure thus allow compact, all-optical, photonic computing devices that operate at higher speed than devices that rely on the use of electrons using electronic chips. The optical devices described herein operate with very little heat dissipation compared with conventional electronic circuitry. According to embodiments of the present disclosure, light intensifier focal planes can also be constructed for use in ultra-sensitive night-vision devices or as detectors in optical communication repeater links. Embodiments of the present disclosure may also be utilized to strengthen decentralized control normally required in communications networks.

According to other embodiments of the present disclosure, the superconducting loop shown in FIG. 5 can be utilized as an optical amplifier for amplifying light from a light source. Embodiments of the present disclosure can thus function as optical repeaters to boost signals in fiber optics transmission lines over large distances, by directly amplifying light in the fiber without turning light into electronic signals with a conversion loss and then reconverted back into light.

The following describes optical amplification devices according to various embodiments of the present disclosure. Faraday rotation of light traveling through a material follows the equation for β in radians:

$$\beta = VBd \quad (1)$$

V=Verdet constant, B is the magnetic field, and d is the optical distance traveled (for Terbium Gallium Garnet it is −100 rad T$^{-1}$ m$^{-1}$).

Faraday rotation depends on the magnetic field direction and not the propagation direction and so for a beam of light going through a material and reflected back through the material, the rotation doubles. Of course, it should be understood that in practice, the rotation may be less than double due to losses at the interfaces.

Assuming that a square Josephson Junction is fabricated at 100 microns (10$^{-4}$ m) on a side and on a substrate 10 microns thick (10$^{-5}$ m) so that it is much larger than a wavelength of light, the ray approximation may be utilized. According to the illustrative embodiment of the present disclosure depicted in FIG. 5, multiple reflections are used, rather than a single pass.

We can reflect a light beam through a layer M times (assume M~1000). A flux quantum is h/2e=2×10$^{-15}$ T m$^2$ and so the field in the PJJ for N trapped magnetic quanta is $$B = \frac{N\phi}{s^2} = 2N \times 10^{-7} T \quad (2)$$

Assuming fields of 10$^3$ Gauss (0.1 T) so the number N of trapped flux quanta is N=10$^6$. The Faraday rotation angle is found for M bounces in the cell and N magnetic quanta:

$$\beta \approx 10^2 NM \times 10^{-12} = NM \times 10^{-10} \text{ rad} \quad (3)$$

Thus we have a flux quantum number N of 10$^6$ and M, a reflection number of 10$^3$ to get rotations of ⅒ radian. Thus we want as strong a magnetic field as possible and as many reflections and as strong a Verdet constant that is possible to achieve high gain.

A PJJ a loop of superconductor material is given a weak link and the Cooper pair wave function is found to decay exponentially into the gap. If the gap material is a photoconductor such as lead sulfide or cadmium sulfide, then the PJJ can be switched with a tiny amount of light.

Photoconductive controlled PJJs are well known and are widely used. Cooper pairs or excited quasiparticles can tunnel across the gap and photons can help the Cooper pairs or excited quasi particles to tunnel more easily and carry current. We can write, for a SIS (Superconducting Insulator Superconducting) gap with a photoconductor filling it, and superconductor with a temperature dependent energy gap $\Delta(T)$ with a combination of a chemical potential $\mu$ and Giaever tunneling theory for photons of energy are far above the energy gap (Van Duzer and Turner, 1999): $\hbar\omega < 2\Delta(T)$. Below the superconducting transition, the non-equilibrium distribution function of optically irradiated quasi particles is described by f(E), a Boltzmann distribution:

$$f(E) = \exp\left[\frac{\mu - E}{k_B T}\right] \quad (4)$$

with a non-vanishing chemical potential:

$$\mu = \frac{k_B T}{2} \ln\left(1 + \frac{2rP_0\tau_{qp}}{\hbar\omega n_o}\right) \quad (5)$$

where $P_o$ is the absorbed photon power in a unit volume of the superconducting island, r is the quasi particle multiplication factor due to electron-electron and electron-phonon interactions, $\tau_{qb}$ is the quasi particle lifetime and the quasi-particle density in equilibrium:

$$n_o = v(0)\sqrt{\frac{\pi k_B T \Delta(T)}{2}} \exp\left(-\frac{\Delta(T)}{k_B T}\right) \quad (6)$$

$$I_p = \frac{G_n}{e} \int_{-\infty}^{+\infty} \frac{E|E - \mu|}{\sqrt{(\mu - E)^2 - \Delta_1^2(T)}} \frac{[f(E - \mu) - f(E)]}{\sqrt{E^2 - \Delta_2^2(T)}} dE \quad (7)$$

This results in a current across the SIS gap in the Josephson Junction that can be written $$I_p(T = 0) = \frac{G_n}{e}\left[(\mu + 2\Delta)E(\alpha) - \frac{4\Delta(\mu + \Delta)}{\mu + 2\Delta}K(\alpha)\right] \quad (8a)$$

Where $E(\alpha)$ and $K(\alpha)$ are elliptic integrals and we have defined:

$$\alpha = \frac{\mu - 2\Delta}{\mu + 2\Delta} \quad (8b)$$

The normalized current switches on are above an illumination power threshold and increases as approximately the square root of illumination above this.

The illumination threshold for switching on current in the superconducting loop is approximately 0.3 microwatt. Assuming this could control light at 100 W/cm² in an area of 100 microns square this means 0.3 microwatt controlling $10^{-2}$ W for a gain of approximately $10^4$. To replace semiconductor chips with all optical chips utilizing embodiments of the present disclosure, the devices can be scaleable in series to the same packing fractions seen for semiconductor transistors and are able to match and exceed its clock speeds. Embodiments of the present disclosure can be made in small size and in large arrays.

Given that photons in a fiber optic cable can move much faster than electrons in a copper wire, the chief impediment to the PETRA switching speed is its loop inductance:

$$L = \frac{d\Phi}{dI} \cong \mu'\pi r^2 \quad (9)$$

Which is approximately its surface area times the magnetic permeability $\mu'$ of its substrate.

There are several ways to alter the performance of the above-described embodiments, For example, making the device size smaller can reduce inductance. The optical device described in the above embodiments controls light passing through it and this means that the Faraday rotation, which depends on thickness, should be preserved, which, in turn, requires the magnetic field strength and Verdet constant to increase. The magnetic field strength can increase if the number of flux quanta is conserved, and fabrication can utilize special magnetic materials, such as magnetic bubble forming garnets that tend to form islands of magnetism. As mentioned above, materials with high Verdet constants are also be used. Therefore, utilizing suitable materials, the devices can be shrunk to micron size and may be utilized to create all-optical computing devices on a chip, allowing much faster and more capable computers without excessive heat. In addition, since the optical devices described herein dissipate very little power, approximately milliwatts per square cm, they can be packed into chips more tightly than current technology electronic transistors.

Numerous additional modifications and variations of the present disclosure are possible in view of the above-teachings. It is therefore to be understood that within the scope of the appended claims, the present disclosure may be practiced other than as specifically described herein. For example, elements and/or features of different illustrative embodiments may be combined with each other and/or substituted for each other within the scope of this disclosure and appended claims.

What is claimed is:

1. An optical device comprising:
   a superconducting material including a photonically controlled Josephson Junction formed by a weak link provided in the superconducting material; and
   a Faraday rotator cell magnetized by the Josephson Junction.

2. The optical device of claim 1, wherein the superconducting material comprises:
   a loop of superconducting material; and
   the weak link is provided in the loop of superconducting material.

3. The optical device of claim 2, wherein the weak link comprises a gap in the loop of superconducting material.

4. The optical device of claim 3, wherein the gap in the loop of superconducting material is filled with a photoconductor.

5. The optical device of claim 4, wherein the photoconductor comprises at least one of lead and cadmium sulphide.

6. The optical device of claim 4, wherein the Faraday rotator cell passes rotated or un-rotated polarized light depending on whether a control light is input to the photoconductor.

7. The optical device of claim 6, wherein the Faraday rotator cell passes un-rotated polarized light when the control light is input to the photoconductor.

8. The optical device of claim 6, further comprising a polarizer that passes un-rotated polarized light and blocks rotated polarized light passing through the Faraday rotator cell.

9. An optical device comprising:
- a loop of superconducting material including a photonically controlled weak link provided in the loop of superconducting material;
- a Faraday material in proximity to the loop of superconducting material; and
- at least one magnet providing a magnetic field in which the loop of superconducting material and Faraday material are immersed.

10. The optical device of claim 9, wherein the weak link is formed by a gap provided in the loop of superconducting material.

11. The optical device of claim 10, wherein the gap is filled with a photoconductive material.

12. The optical device of claim 11, wherein the photoconductive material comprises at least one of lead and cadmium sulphide.

13. The optical device of claim 11, wherein the Faraday material passes rotated or un-rotated polarized light depending on whether a control light is input to the photoconductive material.

14. The optical device of claim 13, wherein the Faraday material passes un-rotated polarized light when the control light is input to the photoconductor.

15. The optical device of claim 13, further comprising a polarizer that passes un-rotated polarized light and blocks rotated polarized light passing through the Faraday material.

* * * * *